(12) United States Patent
Murakami et al.

(10) Patent No.: US 10,557,215 B2
(45) Date of Patent: Feb. 11, 2020

(54) CDTE-BASED COMPOUND SINGLE CRYSTAL AND METHOD FOR PRODUCING THE SAME

(71) Applicant: JX NIPPON MINING & METALS CORPORATION, Tokyo (JP)

(72) Inventors: Kouji Murakami, Kitaibaraki (JP); Akira Noda, Kitaibaraki (JP)

(73) Assignee: JX NIPPON MINING & METALS CORPORATION, Tokyo (JP)

(*) Notice: Subject to any disclaimer, the term of this patent is extended or adjusted under 35 U.S.C. 154(b) by 0 days.

(21) Appl. No.: 15/859,955

(22) Filed: Jan. 2, 2018

(65) Prior Publication Data

US 2018/0127892 A1 May 10, 2018

Related U.S. Application Data

(63) Continuation of application No. PCT/JP2016/059996, filed on Mar. 29, 2016.

(30) Foreign Application Priority Data

Jul. 3, 2015 (JP) ................................. 2015-134716

(51) Int. Cl.
  *C30B 29/48* (2006.01)
  *C30B 33/02* (2006.01)
  (Continued)

(52) U.S. Cl.
  CPC .............. *C30B 29/48* (2013.01); *C01B 19/04* (2013.01); *C30B 11/02* (2013.01); *C30B 33/02* (2013.01);
  (Continued)

(58) Field of Classification Search
  CPC ......... C30B 11/02; C30B 29/48; C30B 33/02; C01B 19/04
  See application file for complete search history.

(56) References Cited

U.S. PATENT DOCUMENTS 5,603,763 A 2/1997 Taniguchi et al.
7,002,230 B2* 2/2006 Hirano .................... C30B 11/00
                                                    257/442

(Continued)

FOREIGN PATENT DOCUMENTS

EP           1897965 A1    3/2008
JP        H01-246199 A    10/1989
(Continued)

OTHER PUBLICATIONS

Avetissov etc., Homogeneity limits and nonstoichiometry of vapor grown ZnTe and CdTe crystals, CrystEngComm, 2015, (17) p. 561-568.*

(Continued)

*Primary Examiner* — Jun Li
(74) *Attorney, Agent, or Firm* — Hauptman Ham, LLP

(57) ABSTRACT

Provided are a high resistance CdTe-based compound single crystal with miniaturized Te precipitates and a method for producing the same. According to one embodiment of the present invention, a CdTe based compound single crystal is provided including a precipitate having a particle size of less than 0.1 μm obtained from an analysis by a light scattering tomography method. In the CdTe based compound single crystal, resistivity may be $1 \times 10^7$ Ωcm or more. In addition, in the CdTe based compound single crystal, a precipitate having a particle size of 0.1 μm or more obtained from the analysis by the light scattering tomography method is not detected. In the CdTe based compound single crystal, the precipitate may be a Te precipitate.

8 Claims, 3 Drawing Sheets

(51) Int. Cl.
*C01B 19/04* (2006.01)
*C30B 11/02* (2006.01)

(52) U.S. Cl.
CPC ...... *C01P 2004/02* (2013.01); *C01P 2004/62* (2013.01); *C01P 2006/40* (2013.01)

(56) References Cited

U.S. PATENT DOCUMENTS

| | | | |
|---|---|---|---|
| 7,758,843 B1 | 7/2010 | Bolotnikov et al. | |
| 9,109,299 B1* | 8/2015 | Motakef | C30B 11/02 |
| 2004/0155310 A1 | 8/2004 | Hirano et al. | |
| 2008/0060729 A1 | 3/2008 | Pelliciari | |
| 2009/0321730 A1* | 12/2009 | Lynn | H01L 31/0296 257/42 |

FOREIGN PATENT DOCUMENTS

| | | | |
|---|---|---|---|
| JP | H03-126693 A | 5/1991 | |
| JP | 2832241 B2 | 12/1998 | |
| JP | 3232461 B2 | 11/2001 | |
| JP | 2004-238268 A | 8/2004 | |
| WO | 99/59199 A1 | 11/1999 | |

OTHER PUBLICATIONS

Tsunemasa etc., High-purity CdTe single Crystals Grown from Solutions, Japan. J. Appl. Phys. vol. 13, No. 7, (1974) p. 1169-1170.*
Shiraki etc., Improvement of the productivity in the growth of CdTe single crystal by THM for hte new PET system, IEEE Transctions on Nuclear Science, vol. 57 No. 1, Feb. 2010, p. 395-399.*
Machine translation of (JPH012461499A), publication dateOct. 1989.*
English translation of Written Opinion of the International Searching Authority dated Jun. 14, 2016 corresponding to International Application No. PCT/JP2016/059996.
The extended European search report for corresponding European application No. 16821068.0 dated Dec. 14, 2018.
International Search Report dated Jun. 14, 2016 corresponding to International Application No. PCT/JP2016/059996.
Written Opinion of the International Searching Authority dated Jun. 14, 2016 corresponding to International Application No. PCT/JP2016/059996.

* cited by examiner

CDTE-BASED COMPOUND SINGLE CRYSTAL AND METHOD FOR PRODUCING THE SAME

CROSS REFERENCE TO RELATED APPLICATIONS

This application is based upon and claims the benefit of priority from the prior Japanese Patent Application No. 2015-134716, filed on Jul. 3, 2015, and PCT Application No. PCT/JP2016/059996, filed on Mar. 29, 2016, the entire contents of which are incorporated herein by reference.

FIELD

The present invention relates to a CdTe-based compound single crystal and a method for producing the same. In particular, the present invention relates to a CdTe compound single crystal containing small precipitates and a method for producing the same.

BACKGROUND

Conventionally, the development of direct conversion type compound semiconductors having high efficiency and high resolution and being excellent in miniaturization is proceeding in radiation detection element applications. Among them, cadmium telluride (CdTe), cadmium selenium telluride (CdSeTe), cadmium zinc telluride (CdZnTe), cadmium zinc selenium telluride (CdZnSeTe) which are II-VI compound semiconductors are attracting attention in recent years as promising materials. Although these are referred to as CdTe-based semiconductors herein, compared to semiconductors such as silicon (Si) and germanium (Ge) and the like, these semiconductors have the merits of (1) high detection efficiency of radiation since their atomic number is relatively large, (2) a cooling device is not necessary since the band gap is large and the influence of thermal noise current is small. When radiation enters in a state in which an electric field is applied to a semiconductor attached with electrodes, electrons and holes are generated in the semiconductor and mutually proceed along the applied electric field in opposite directions. In this way, radiation is detected by extracting the induced current as a signal.

In the growth process of a CdTe-based compound single crystal which is a CdTe-based semiconductor, high vapor pressure Cd easily escapes from a single crystal and inevitably Te precipitates are generated in the single crystal. In the conventional growth technique of a single crystal, efforts have been made to reduce the precipitate size by controlling Cd vapor pressure during crystal growth (U.S. Pat. No. 3,232,461).

When Te precipitates are present in a CdTe-based compound single crystal, a drop in radiation detection sensitivity occurs in the region where Te precipitates are present, and in the case when a CdTe-based compound single crystal substrate is used in a radiation detection element for imaging, defects in the image are likely to occur. The pitch size of pixel electrodes which are required for a CdTe-based compound single crystal substrate to be used for imaging sensor applications have become smaller year by year, miniaturization in the size of the Te precipitates and a reduction in a Te precipitate concentration are required.

In the conventional growth technique of a single crystal, while a technique has been reported in which a CdTe-based compound single crystal is grown while applying a Cd vapor pressure, and furthermore, after single crystal growth, Te precipitates are miniaturized by applying a Cd vapor pressure and performing a heat treatment (post annealing), a technique for miniaturizing Te precipitates or getting rid of the Te precipitates and sufficiently reducing the Te precipitate concentration has not been reached (U.S. Pat. No. 2,832,241).

Here, a substrate having a high resistance is demanded for a CdTe-based compound single crystal for use in radiation detector applications. A CdTe-based compound single crystal shows p-type conductivity electrical properties in which Cd vacancies which are one crystal defect within the single crystal immediately after the growth (as-grown) are present, which contribute to the p-type conductivity. In order to make a CdTe-based compound single crystal high resistance, by adding impurities (for example, chlorine) which contribute to n-type conductivity as a dopant, and compensating for carriers by a p-type acceptor of Cd vacancies and the n-type donor of chlorine element, it is possible to manufacture a high resistance CdTe-based compound single crystal useful for radiation detector applications. However, the problem of the precipitates described above has not been solved even for a CdTe-based compound single crystal with the addition of impurities (Japanese Laid Open Patent Publication No. 2004-238268).

When annealing is performed while applying a Cd vapor pressure in order to miniaturize Te precipitates or reduce the concentration of Te precipitates, even if it is effective in reducing Te precipitates, the vacancy concentration of Cd also changes, the compensation relationship of the carriers collapses which is likely to make n-type and realizing a high resistance is difficult.

SUMMARY

The present invention has been made in order to solve the problems of the conventional technology described above by providing a high resistance CdTe-based compound single crystal with miniaturized Te precipitates. In addition, a method for producing the same is also provided.

According to one embodiment of the present invention, a CdTe based compound single crystal is provided including a precipitate having a particle size of less than 0.1 μm obtained from an analysis by a light scattering tomography method.

In the CdTe based compound single crystal, resistivity may be $1 \times 10^7$ Ωcm or more.

In the CdTe based compound single crystal, a precipitate having a particle size of 0.1 μm or more obtained from the analysis by the light scattering tomography method is not detected.

In the CdTe based compound single crystal, the precipitate may be a Te precipitate.

In the CdTe based compound single crystal, n-type impurities having a predetermined concentration may be contained.

In the CdTe based compound single crystal, the n-type impurity may be Ga, In or Cl.

In addition, according to one embodiment of the present invention, a method for producing a CdTe based compound single crystal is provided including performing a first heat treatment by heat treating the CdTe based compound single crystal at a temperature of 920° C. or more and 970° C. or less, and a Cd vapor pressure of 0.0497 MPa or more and 0.0523 MPa or less, and performing a second heat treatment by heat treating the CdTe based compound single crystal at a temperature of 920° C. or more and 970° C. or less, and a Cd vapor pressure of 0.0377 MPa or more and 0.0397 MPa or less.

In the method for producing a CdTe based compound single crystal, the temperature of the first heat treatment and the temperature of the second heat treatment may be 930° C. or more and 960° C. or less.

In the method for producing a CdTe based compound single crystal, the temperature of the first heat treatment may be 940° C. or more and 950° C. or less and the temperature of the second heat treatment may be 945° C. or more and 955° C. or less.

In the method for producing a CdTe based compound single crystal, the CdTe based compound single crystal may be a single crystal grown by melting a raw material including Zn and/or any one element selected from Cl, In, Ga with Cd, Te as main components.

REFERENCE SIGNS LIST

Figure 1:
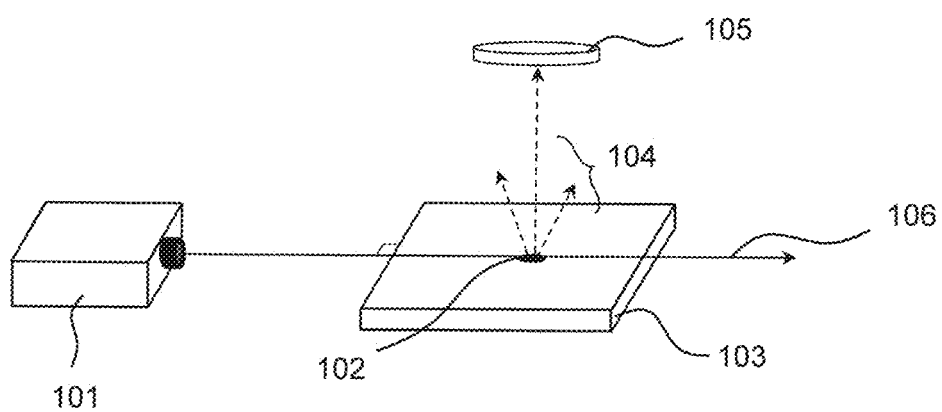
FIG. 1 is a schematic diagram showing a laser light source 101 for measuring the size of precipitates within a crystal by 90° scattering LST, a CdTe-based compound single crystal (sample substrate) 103 and a detector 105 according to one embodiment of the present invention.

101: laser light source, 102: precipitates, 103: sample substrate, 104: scattered light, 105: detector, 106: infrared laser proceeding direction, 300: production device, 301: crucible, 310: main body, 311: upper main body, 313: lower main body, 321: spacer, 330: quartz ampule, 331: crucible housing, 333: reservoir, 351: first heater, 352: second heater, 353: third heater, 354: fourth heater, 355: fifth heater, 356: sixth heater, 357: seventh heater, 358: eighth heater, 359: ninth heater

DESCRIPTION OF EMBODIMENTS

A CdTe-based compound single crystal and a method for producing the same according to the present invention are explained below while referring to the drawings. The CdTe-based compound single crystal and method for producing the same of the present invention are not to be interpreted as being limited to the description of the embodiments and examples shown below. In the drawings referred to in the embodiments and examples referenced later, the same parts or parts having similar functions are attached with the same reference numerals and repeated explanations thereof are omitted.

The CdTe-based compound single crystal according to the present invention is a single crystal with precipitate having a particle size of less than 0.1 µm by analysis using a light scattering tomography method. In addition, in the CdTe-based compound single crystal according to the present invention, precipitates with a particle size of 0.1 µm or more are not detected by a light scattering tomography method. In this way, a novel single crystal CdTe-based compound single crystal in which the particle size of the precipitates can be miniaturized or can be eliminated has not been reported so far. In the present specification, the precipitates contained in the CdTe-based compound single crystal are Te precipitates.

In the present specification, analysis of the precipitates is performed by a light scattering tomography (Laser Scattering Tomography, LST) method. More specifically, the precipitates are evaluated by 90° scattering LST. FIG. 1 is a schematic diagram showing a laser light source 101 for measuring the size of precipitates by a crystal by 90° scattering LST, a CdTe-based compound single crystal (sample substrate) 103 and a detector 105. A length 5 mm×breadth 5 mm×thickness 2 mm of sample substrate 103 is placed inside a black-out curtain so that the proceeding direction 106 of an infrared laser with respect to the sample substrate 103 which is used for measurement becomes parallel to the direction of the upper and lower surfaces of the sample substrate. Infrared laser is irradiated perpendicular to the side surface onto the central part of the side surface corresponding to the thickness direction of the sample substrate 103, the scattered light 104 scattered in a direction perpendicular to the irradiation direction of the infrared laser and scattered above the sample substrate surface by the precipitates 102 is detected by a detector 105 which is arranged above the upper surface of the sample substrate 103. It is possible to use an optical microscope with a CCD camera as the detector 105. In the present specification, the particle size of the precipitates is defined as the diameter of the smallest circle enclosing the precipitates observed by the detector 105.

Analysis of the precipitate is performed by placing the sample substrate 103 on a movable optical microscope stage by automatic control, an arbitrary position of the sample substrate, for example, the center part of the sample substrate, or a periphery part is measured at four stages (moving distance of 1 mm per stage) in each direction of the x-axis (optical axis direction) and y-axis (a direction parallel to the stage and perpendicular to the optical axis) by automatic control, and field images in a measurement region of a total of 16 points (measurement region per field of view is 0.4 $cm^2$) are photographed by the detector 105, and after binarizing the photographed image in black and white, the light and dark areas of the image are automatically analyzed by image analysis software (for example, Image-Pro by Media Cybernetics, Inc.) and the particle size and the number of precipitates is measured. By obtaining a particle size of each bright spot and a histogram for each particle size in the binarized image, it is possible to automatically sectionalize precipitates into particle size. Furthermore, at the time of filing the present application, the detection limit of the precipitates is 0.1 µm.

Therefore, the CdTe-based compound single crystal according to the present invention is a single crystal in which the particle size of precipitates less than 0.1 µm and a precipitate having a particle size of 0.1 µm or more is not detected by analysis by a light scattering tomography method, and a CdTe-based compound single crystal in which it is possible to reduce the particle size less to than 0.1 µm or in which a precipitate of 0.1 µm or more is not present has not been reported so far and therefore it is a high quality CdTe-based compound single crystal not conventionally presented.

In the present specification, the CdTe-based compound single crystal indicates a compound single crystal in which Cd and Te are the main components (that is, any component with a higher mass concentration than these is not contained), and a compound single crystal in which either Cd and Te or a part of both is substituted with other elements is included. For example, CdTe, CdZnTe, CdSeTe, CdZnSeTe, CdHgTe, and the like are exemplified. In addition, the presence of impurities that are inevitably included is acceptable.

In addition, in one embodiment, impurity elements may be doped in order to add various properties to the compound single crystal. For example, in the case when a CdTe-based compound single crystal is used as a substrate of a radiation detector element, a photorefractive element or an electro-optical element (EO element), in order to improve device characteristics, group 13 (3B) elements such as Al (aluminum), Ga (gallium), In (indium), group 17 (7B) group elements such as F (fluorine), Cl (chlorine), Br (bromine), I (iodine), group 14 (4B) group elements such as Ge (germanium), Sn (tin), and transition metal elements such as V (vanadium) can be doped to obtain high resistance. Conversely, for the purpose of obtaining lower resistance, first group elements such as Li and Na can also be doped.

The CdTe-based compound single crystal according to the present invention has resistivity of $1 \times 10^7$ Ωcm or more, preferably $1 \times 10^9$ Ωcm or more. In one embodiment, the CdTe-based compound semiconductor single crystal preferably contains a predetermined concentration of Cl, for example, the doping amount of Cl can be added so that the Cl concentration in the single crystal is 40 wt ppm or more and 300 wt ppm or less. In addition to Cl, in the case of adding In, 0.3 wt ppm or more and 12 wt ppm or less is preferred and in the case of adding Ga, 1.8 wt ppm or more and 2.2 wt ppm or less is preferred.

(Method for Producing CdTe-Based Compound Single Crystal)

In the CdTe-based compound single crystal according to the present invention, the precipitates can be miniaturized by optimizing the annealing conditions after crystal growth. Furthermore, by establishing a crystal defect acceptor concentration (Cd vacancy concentration) which contributes to electrical conductivity, and a compensation mechanism of carriers by n-type impurity elements, it is possible to obtain a CdTe-based compound single crystal with high resistance.

Figure 2:
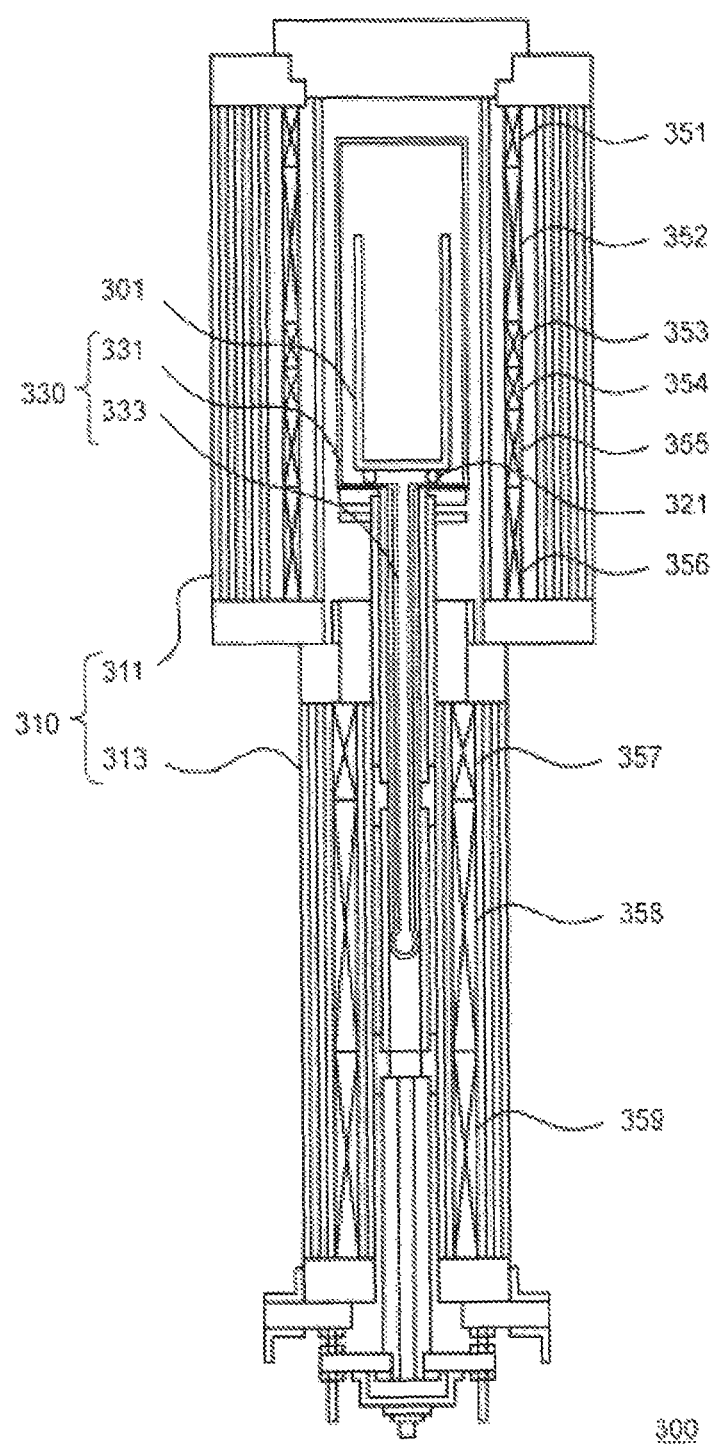
FIG. 2 is a schematic view of a production device according to one embodiment of the present invention.

FIG. 2 is a schematic diagram showing an example of a production device used for the production of the CdTe-based compound single crystal according to the present invention. Although a liquid phase growth method using a boat method such as a HB method (Horizontal Bridgman Method), VB method (Vertical Bridgman Method), HGF method (Horizontal Gradient Freezing Method), VGF method (Vertical Gradient Freezing method) are known as a method for producing a CdTe-based compound single crystal, it is preferred to use a device for the VGF method as the production device 300 of the CdTe-based compound single crystal according to the present invention.

In one embodiment, the production device 300 is an electric furnace formed by a main body 310, a first heater 351 to ninth heater 359 and a quartz ampule 330 and so on. The main body 310 is arranged with a cylindrical upper main body 311 and a cylindrical lower main body 313 narrower in width than the upper main body 311, and an inner space of the upper main body 311 and the inner space of the lower main body 313 are linked.

The first heater 351 to the ninth heater 359 are arranged on an inner wall of the main body 310. The first heater 351 to sixth heater 356 are arranged on an inner wall of the upper main body 311, and the seventh heater 357 to ninth heater 359 are arranged in annularly on the inner wall of the lower main body 313. The heating temperature of the first heater 351 to ninth heater 359 can be set independently.

The quartz ampule 330 is arranged with a cylindrical crucible housing 331 and a tube shaped reservoir 333 extending downwards from the lower part of the cylindrical crucible housing 331. The quartz ampule 330 is arranged within the main body 310, and the reservoir 333 is inserted into the lower main body 313. The cylindrical crucible housing 331 is surrounded by the first heater 351 to fifth heater 355, and the reservoir 333 is surrounded by the sixth heater 356 to the ninth heater 359. A spacer 321 is placed in the cylindrical crucible housing 331, and the crucible 301 is housed. The spacer 321 provides a gap for introducing Cd vapor from the reservoir 333 toward the cylindrical crucible housing 331.

In the production of the CdTe-based compound single crystal according to the present invention, a group II element and a group VI element are respectively enclosed as a single unit within the quartz ampule 330, the raw material elements are heated to above melting point in the production device 300 to melt and reactive synthesize, and further the synthesized raw materials are melted by raising the temperature above the melting point, and after holding for a predetermined time in a molten state, a single crystal is grown (crystal growth process). In order to miniaturize the precipitate, the obtained single crystal is heat treated (heat treatment process). In addition, in order to obtain a high resistance CdTe-based compound single crystal, further heat treatment of the single crystal is performed (re-heating treatment process).

In the crystal growth process according to the present invention, a single crystal is grown from a melt of a CdTe-based compound containing Cd and Te or other elements according to necessity using the production device 300. Specifically, the raw material (for example, in the case of a Cl-doped CdZnTe single crystal, Cd, Te, Zn and Cl) is put into the crucible 301. At this time, the respective amounts of these are adjusted so that the contained ratio of Zn in the entire raw material is 1 at % or more and 5 at % or less, that is, the composition of the single crystal ingot to be $Cd_{1-X}Zn_XTe$ (X=0.02 or more and 0.1 or less), and the concentration of Cl to be 40 wt ppm or more and 300 wt ppm or less. The Cd is put into the reservoir 333 of the quartz ampoule 330, and the crucible 301 containing the raw material is placed on the crucible housing 331 in the quartz ampoule 330. Furthermore, it is possible to use a crucible made of pBN for the crucible 301.

Next, the quartz ampule 330 is vacuum-sealed, the quartz ampule 330 is heated by the first heater 351 to ninth heater 359, and the Cd of the reservoir 333 is volatilized as well as melting the raw materials in the crucible 301. At this time, the temperature of the first heater 351 to the sixth heater 356 of the crucible housing 331 was raised so that each sealed element is melted, after each element is combined, the temperature is further raised and the combined elements are melted at a temperature above the melting point of a II-VI compound semiconductor and held for a predetermined time in the melt state. In addition, during the elevated temperature process, the temperature of the seventh heater 357 and the eighth heater 358 is adjusted so that vapor pressure of Cd is within the range of 0.12 to 0.14 MPa. In this way, when growing a CdTe-based single crystal, by applying the Cd vapor pressure of a predetermined range in the quartz ampule and performing growing of the single crystal, it is possible to miniaturize the size of Te precipitates to a level of several μm. However, the generation of Te precipitates is not completely suppressed.

At the point when the raw material of the crucible 301 is melted, the temperature of the first heater 351 to the sixth heater 356 is adjusted to be lower toward the upper side of the heater than the sixth heater 356, and a temperature gradient from the upper end to the lower end of the melt is generated. Due to this temperature gradient, a CdTe-based compound single crystal is grown in the surface part of the melt where the temperature is lowest. Next, by gradually lowering the heating temperature of all the heaters while maintaining the temperature gradient, a single crystal is grown in a downward direction to a predetermined length.

(Heat Treatment Process)

The CdTe-based compound single crystal obtained by the crystal growth process is processed by a heat treatment process (first heat treatment). While the grown CdTe-based compound single crystal is held in the quartz ampule 330, the furnace temperature is decreased from the temperature at the completion of growth of the single crystal to 920° C. or more and 970° C. or less, preferably 930° C. or more and 960° C. or less, and more preferably 940° C. or more and 950° C. or less by adjusting the temperature of the first heater 351 to ninth heaters 359. It is preferred that Cd vapor pressure is 0.0497 MPa or more and 0.0523 MPa or less. While in this state, the CdTe-based compound single crystal is heat treated (annealed) for 15 hours or more and 25 hours or less, preferably 18 hours or more and 23 hours less, more preferably 19 hours or more and 21 hours or less. In the production method of the CdTe-based compound single crystal according to the present invention, by this heat treatment process, it is possible to obtain a CdTe-based compound single crystal in which precipitates are miniaturized, the particle size of the precipitates becomes smaller than 0.1 μm and a precipitate with a size of 0.1 μm or more is not detected by a light scattering tomography (LST) method. In addition, the resistivity of the CdTe-based single crystal after this heat treatment is $2 \times 10^2$ Ωcm or less.

(Re-Heat Treatment Process)

In the method for producing the CdTe-based compound single crystal according to the present invention, after the single crystal growth, by performing a heat treatment again (second heat treatment) on the CdTe type compound single crystal subjected to a first heat treatment, it is possible to obtain a CdTe-based compound single crystal with high resistance. In the second heat treatment, the CdTe-based compound single crystal which was subjected to a first heat-treatment is brought out from the quartz ampule 330, and again separately prepared by vacuum-sealing in a separate quartz ampoule 330-1, or may be re-heated at a second stage in succession without being brought out from the quartz ampule 330. The same device as the production device 300 used for crystal growth can be used. In the re-heat treatment process, the furnace temperature is changed from the first heat treatment temperature to 920° C. or more and 920° C. or less, preferably 930° C. or more and 960° C. or less, more preferably 945° C. or more and 955° C. It is preferred that the vapor pressure is 0.0377 MPa or more and 0.0397 MPa or less. The CdTe-based single crystal in this state is heat treated for 24 hours or more and 120 hours or less, preferably 36 hours or more and 100 hours or less, and more preferably 48 hours or more and 96 hours or less.

Furthermore, although it is thought that there is no large difference in the processing conditions of the first heat treatment and the second heat treatment, the first heat treatment affects miniaturization of Te precipitates, and the second heat treatment finely-adjusts the composition of the CdTe-based single crystal after the first heat treatment very slightly to the Te composition side from the Cd composition side, a very small concentration of Cd vacancies with a p-type conductivity is raised after the second heat treatment, the resistivity can be increased by compensating for n-type carriers, and it is possible to manufacture useful single crystals as a CdTe-based single crystal substrate for a radiation detector. In the present invention, although the first heat treatment and second heat treatment can be considered as being performed under substantially the same conditions, the second heat treatment which has this very small different condition is effective for miniaturization of precipitates, or forming a high resistance CdTe-based single crystal after eliminating the precipitates.

In the method for producing the CdTe-based compound single crystal according to the present invention, by the heat treatment process described above, it is possible to obtain a CdTe-based compound single crystal in which precipitates are miniaturized, the size of precipitates is less than 0.1 μm, and a precipitate with a size of 0.1 μm or more in an analysis by a light scattering tomography method is not detected. In addition, by performing the re-heat treatment as described above, a high resistance CdTe-based compound single crystal can be obtained.

Example 1

FIG. 2 is a schematic view of a furnace used in a Vertical Gradient Freezing method (VGF) according to the present invention. First, in the crystal growth process, a single crystal was grown from the melt of CdZnTe. Specifically, first, Cd, Te, Zn, and Cl were placed in the crucible 301 as a raw material. At this time, the respective amounts of the composition were adjusted so that the contained ratio of Zn in the entire raw material was 1 at % to 5 at %, that is, the composition of the single crystal ingot to be produced becomes $Cd_{1-X}Zn_XTe$ (X=0.02 to 0.1), and the Cl concentration in the single crystal becomes 40 wt ppm to 300 wt ppm. Next, Cd was put into the reservoir 333 of the quartz ampoule 330, and the crucible 301 containing the raw material was placed in the quartz ampoule 330. Next, the quartz ampoule was vacuum-sealed, the quartz ampule 330 was heated by the first heater 351 to ninth heater 359, the raw material in the crucible 301 was melted, the raw materials are combined, the temperature was further raised and the combined CdZnTe was melted. In addition, the Cd of the reservoir 333 was volatilized during the heating process. At this time, the vapor pressure of Cd was adjusted by adjusting the temperature of the seventh heater 357 and the eighth heater 358.

Next, when the raw material of the crucible 301 was melted, the temperature of the first heater 351 to the sixth heater 356 was adjusted so as to be lower from the sixth heater 356 toward an upper side heater, thereby a temperature gradient was generated from the upper end to the lower end of the melt, and a single crystal of CdZnTe was grown on the surface layer part of the melt where the temperature was lowest. Next, by gradually reducing the heating temperature of all of the heaters while maintaining the temperature gradient, a CdZnTe single crystal was grown in which the Cl concentration was 40 to 300 wt ppm toward the bottom part from the top part of the single crystal and the Zn composition is $Cd_{1-X}Zn_XTe$ (X=0.02 to 0.1).

(Heat Treatment Process)

In the processes described above, by adjusting the respective temperatures of the first heater 351 to ninth heaters 359 while holding the grown CdZnTe single crystals in the quartz ampule, the furnace temperature was lowered to 943.5° C. from a temperature at the time of growth completion of the single crystal. Cd vapor pressure was controlled to 0.0510 MPa and a first heating treatment was performed on the CdZnTe single crystal in this state for 20 hours.

Figure 3A:
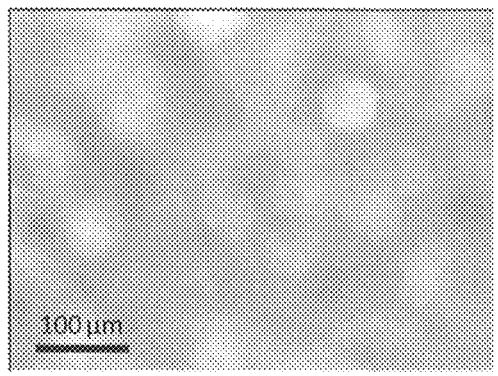
FIG. 3A shows observation results of precipitates according to one example of the present invention and shows a differential interference contrast (DIC) microscopic image.
Figure 3B:
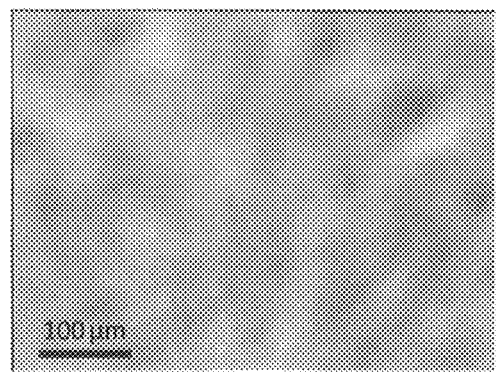
FIG. 3B shows a differential interference contrast microscopic image.
Figure 3C:
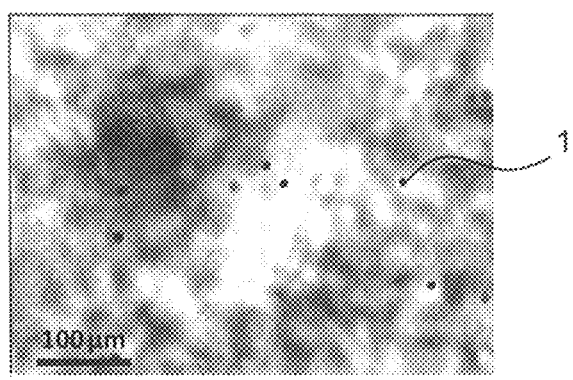
FIG. 3C shows a differential interference contrast microscopic image.
Figure 3D:
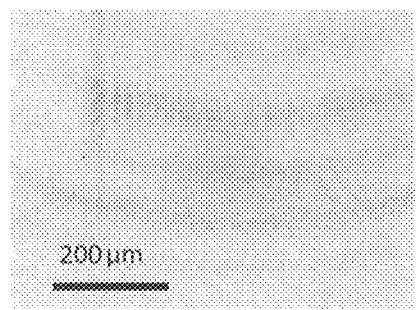
FIG. 3D shows an observation image by light-scattering tomography.

Following this, crystals were extracted and precipitates were observed. Observation of the precipitates was carried out by a light scattering tomography (LST) method. FIG. 3A shows a CdZnTe single crystal after the first heat treatment observed with a differential interference contrast (DIC) microscopy, FIG. 3B shows a CdZnTe single crystal after the second heat treatment observed with a differential interference contrast (DIC) microscopy, and FIG. 3C shows a CdZnTe single crystal after the single crystal growth and before a heat treatment observed with a differential interference contrast (DIC) microscopy. In addition, FIG. 3D shows a CdZnTe single crystal after the second heat treatment observed by a LST method.

The result was that it was not possible to confirm the presence of precipitates. That is, normally, Te precipitates with a size of several μm are observed by a differential interference contrast (DIC) microscopy after the growth of a CdTe-based single crystal (see FIG. 3C), due to the first heat treatment of the present invention, the precipitates were not observed (FIG. 3A, FIG. 3B), and furthermore, from the observation by light scattering tomography (LST), the size of precipitates can be said to be less than 0.1 μm due to the detection sensitivity of LST (FIG. 3D). In addition, electrical resistivity was examined to be $2.28 \times 10^{-1}$ Ωcm.

Next, the CdZnTe single crystals were sealed again in a quartz ampule which was separately prepared, and a second heat treatment was performed at 950° C. with the Cd vapor pressure at 0.0387 MPa for 20 hours. When precipitates of the crystals were observed by LST, it was impossible to confirm the presence of precipitates, and it can be determined that the size remained below 0.1 μm. Furthermore, the electrical resistivity was examined to be high at $6.41 \times 10^7$ Ωcm, thus, high resistivity was found. Here, resistivity after the first heat treatment was $2.28 \times 10^{-1}$ Ωcm, and resistivity after the second heat treatment was higher at $6.41 \times 10^7$ Ωcm, thus, resistivity was higher. It is thought that this is because Te precipitates in the CdZnTe single crystal are miniaturized or eliminated in the first heat treatment, the composition ratio of group II elements (Cd, Zn) and group VI elements (Te) deviated very slightly to the Cd composition side, and the concentration of Cd vacancies was increased in the second heat treatment, with respect to the amount that the concentration of Cd vacancies which function as an acceptor decreases to raise the p-type conductivity and provide high resistance.

Example 2

As Example 2, apart from Cd, Te, Zn, and In being put into the crucible 301 as a raw material, and the concentration of In in the single crystal being set to 0.03 to 6.3 wt ppm, a CdZnTe single crystal was grown using the same conditions as in Example 1. Next, while holding the grown CdZnTe single crystals in a quartz ampule, the furnace temperature was reduced from the temperature at the time of completion of growth of the single crystal to 920° C. by adjusting the respective temperatures of the first heater 351 to ninth heater 359. Cd vapor pressure was controlled to 0.0497 MPa, and a first heat treatment was carried out on the CdZnTe single crystal in this state for 25 hours. Next, while holding the CdZnTe single crystal after the first heat treatment in the quartz ampoule, a second heat treatment was performed at 970° C. and a Cd vapor pressure of 0.0397 MPa for 24 hours. When the precipitates of the crystals were observed by LST, it was impossible to confirm the presence of precipitates and the size thereof was less than 0.1 μm. Furthermore, when electrical resistivity was examined, it had become $3.73 \times 10^7$ Ωcm and a high resistance was confirmed.

Example 3

As Example 3, apart from Cd, Te, Zn, and Ga being put into the crucible 301 as a raw material, and the concentration of Ga in the single crystal being set to 0.4 to 0.6 wt ppm, a CdZnTe single crystal was grown using the same conditions as in Examples 1 and 2. Next, while holding the grown CdZnTe single crystals in a quartz ampule, the furnace temperature was reduced from the temperature at the time of completion of growth of the single crystal to 970° C. by adjusting the respective temperatures of the first heater 351 to ninth heater 359. Cd vapor pressure was controlled to 0.0523 MPa, and a first heat treatment was carried out on the CdZnTe single crystal in this state for 15 hours. Next, while holding the CdZnTe single crystal after the first heat treatment in the quartz ampoule, a second heat treatment was performed at 920° C. and a Cd vapor pressure of 0.0377 MPa for 120 hours. When the precipitates of the crystals were observed by LST, it was impossible to confirm the presence of precipitates and the size thereof was less than 0.1 μm. Furthermore, when electrical resistivity was examined, it had become $2.83 \times 10^7$ Ωcm and a high resistance was confirmed.

Example 4

As Example 4, apart from Cd, Te and Cl being field into the crucible 301 as a raw material, a CdTe single crystal was grown using the same conditions as in Example 1. Next, while holding the grown CdTe single crystals in a quartz ampule, the furnace temperature was reduced from the temperature at the time of completion of growth of the single crystal to 943.5° C. by adjusting the respective temperatures of the first heater 351 to ninth heater 359. Cd vapor pressure was controlled to 0.0510 MPa, and a first heat treatment was carried out on the CdTe single crystal in this state for 20 hours. Next, while holding the CdTe single crystal after the first heat treatment in the quartz ampoule, a second heat treatment was performed at 950° C. and a Cd vapor pressure of 0.0387 MPa for 20 hours. When the precipitates of the crystals were observed by LST, it was impossible to confirm the presence of precipitates and the size thereof was less than 0.1 μm. Furthermore, when electrical resistivity was examined, it had become $1.49 \times 10^7$ Ωcm and a high resistance was confirmed.

Comparative Example

As a comparative example, while the CdZnTe single crystal grown under the same conditions as in Example 1 was held in a quartz ampoule, a heat treatment was performed with the furnace temperature from the temperature at the completion of growth of the single crystal to 950° C., and Cd vapor pressure at 0.0460 MPa for 40 hours. Following this, the crystals were extracted and as a result of observation of the precipitates, precipitates existed having a size of 0.13 to 0.15 µm, and when the electrical resistivity was examined, it was n-type $1.66 \times 10^1$ Ωcm which is not a high resistivity and has insufficient characteristics for use in a radiation detector.

According to the present invention, a high resistance CdTe-based compound single crystal with miniaturized Te precipitates is provided. In addition, according to the present invention, a method for producing a high resistance CdTe-based compound single crystal with miniaturized Te precipitates is provided.

What is claimed is:

1. A CdTe based compound single crystal comprising:
a precipitate consisting essentially of particles having a particle size of less than 0.1 µm obtained from an analysis by a light scattering tomography method, and an n-type impurity being Ga, In or Cl, wherein
a concentration of Ga is 1.8 ppmwt or more and 2.2 ppmwt of less of the CdTe based compound,
a concentration of In is 0.3 ppmwt or more and 6.3 ppmwt of less of the CdTe based compound, and
a concentration of Cl is 40 ppmwt or more and 300 ppmwt of less of the CdTe based compound.

2. The CdTe based compound single crystal according to claim 1, wherein resistivity is $1 \times 10^7$ Ωcm or more.

3. The CdTe based compound single crystal according to claim 1, wherein a precipitate having a particle size of 0.1 µm or more obtained from the analysis by the light scattering tomography method is not detected.

4. The CdTe based compound single crystal according to claim 1, wherein the precipitate is a Te precipitate.

5. A method for producing the CdTe based compound single crystal of claim 1 comprising a precipitate consisting essentially of particles having a particle size of less than 0.1 µm obtained from an analysis by a light scattering tomography method comprising:
performing a first heat treatment by heat treating the CdTe based compound single crystal at a temperature of 920° C. or more and 970° C. or less, and a Cd vapor pressure of 0.0497 MPa or more and 0.0523 MPa or less; and
performing a second heat treatment by heat treating the CdTe based compound single crystal at a temperature of 920° C. or more and 970° C. or less, and a Cd vapor pressure of 0.0377 MPa or more and 0.0397 MPa or less.

6. The method for producing a CdTe based compound single crystal according to claim 5, wherein the temperature of the first heat treatment and the temperature of the second heat treatment are 930° C. or more and 960° C. or less.

7. The method for producing a CdTe based compound single crystal according to claim 5, wherein the temperature of the first heat treatment is 940° C. or more and 950° C. or less and the temperature of the second heat treatment is 945° C. or more and 955° C. or less.

8. The method for producing a CdTe based compound single crystal according to claim 5, wherein the CdTe based compound single crystal is a single crystal grown by melting a raw material including Zn and/or any one element selected from Cl, In, Ga with Cd, Te as main components.

* * * * *